United States Patent
Lewis

(10) Patent No.: US 9,740,330 B2
(45) Date of Patent: *Aug. 22, 2017

(54) TOUCH SENSOR

(71) Applicant: Atmel Corporation, San Jose, CA (US)

(72) Inventor: Lowry D. Lewis, Raleigh, NC (US)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/294,922

(22) Filed: Oct. 17, 2016

(65) Prior Publication Data

US 2017/0031513 A1    Feb. 2, 2017

Related U.S. Application Data

(63) Continuation of application No. 14/528,249, filed on Oct. 30, 2014, now Pat. No. 9,478,189.

(51) Int. Cl.
| | | |
|---|---|---|
| *G06F 3/045* | (2006.01) | |
| *G06F 3/041* | (2006.01) | |
| *G06F 3/044* | (2006.01) | |
| *G09G 5/00* | (2006.01) | |
| *H03K 17/96* | (2006.01) | |

(52) U.S. Cl.
CPC ............ *G06F 3/0416* (2013.01); *G06F 3/044* (2013.01); *G06F 3/0412* (2013.01); *G09G 5/003* (2013.01); *H03K 17/962* (2013.01); *H03K 17/9622* (2013.01); *G09G 2300/0426* (2013.01); *H03K 2017/9604* (2013.01)

(58) Field of Classification Search
None
See application file for complete search history.

(56) References Cited

U.S. PATENT DOCUMENTS

| | | | |
|---|---|---|---|
| 8,217,915 B2 | 7/2012 | Philipp | |
| 8,502,796 B1 | 8/2013 | Yilmaz | |
| 9,478,189 B2 | 10/2016 | Lewis | |
| 2010/0045632 A1 | 2/2010 | Yilmaz et al. | |
| 2010/0258360 A1 | 10/2010 | Yilmaz | |
| 2010/0301879 A1* | 12/2010 | Philipp ............... | G06F 3/03547 324/679 |
| 2012/0044095 A1* | 2/2012 | Makovetskyy ......... | G06F 3/044 341/33 |
| 2013/0100038 A1 | 4/2013 | Yilmaz et al. | |

* cited by examiner

*Primary Examiner* — Ilana Spar
*Assistant Examiner* — Kirk Hermann
(74) *Attorney, Agent, or Firm* — Fish & Richardson P.C.

(57) ABSTRACT

In one aspect, a touch sensor includes a dielectric surface layer; drive electrodes disposed on the dielectric surface layer and arranged radially about a center, the drive electrodes defining a perimeter about the center, and a sense electrode disposed on the dielectric surface layer and arranged between two of the drive electrodes. Each drive electrode can include: an outer radial section extending radially along the perimeter; a central section extending from the outer radial section towards the center; and an inner radial section comprising a first section extending radially away from the central section in a first radial direction and a second section, shorter than the first section, extending radially away from the central section in a second radial direction.

20 Claims, 6 Drawing Sheets under test. The charge is accumulated on a sampling

TOUCH SENSOR

CLAIM OF PRIORITY

This application is a continuation and claims priority to U.S. patent application Ser. No. 14/528,249, filed on Oct. 30, 2014, the entire contents of which are hereby incorporated by reference.

TECHNICAL FIELD

This disclosure relates generally to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), Smartphone, satellite navigation device, portable media player, portable game console, kiosk computer, point-of-sale device, or other suitable device. A control panel on a household or other appliance may include a touch sensor.

One example of a touch sensor is a capacitive touch sensor. When an object touches or comes within proximity of the surface of the capacitive touch sensor, a change in capacitance may occur within the sensor at the location of the touch or proximity. A touch sensor controller may process the change in capacitance to determine its position on the touch screen.

SUMMARY

This specification describes a number of example touch sensors. In one aspect, a touch sensor includes a dielectric surface layer; drive electrodes disposed on the dielectric surface layer and arranged radially about a center, the drive electrodes defining a perimeter about the center; and a sense electrode disposed on the dielectric surface layer and arranged between two of the drive electrodes. Each drive electrode can include: an outer radial section extending radially along the perimeter; a central section extending from the outer radial section towards the center; and an inner radial section comprising a first section extending radially away from the central section in a first radial direction and a second section, shorter than the first section, extending radially away from the central section in a second radial direction.

In another aspect, a touch sensor includes a dielectric surface layer; drive electrodes disposed on the dielectric surface layer and collectively arranged in a rectangular pattern; and a sense electrode disposed on the dielectric surface layer and arranged between two of the drive electrodes. Each drive electrode can include: a first horizontal section extending along a horizontal direction; a vertical section extending along a vertical direction; and a second horizontal section extending along the horizontal direction from the vertical section towards an adjacent drive electrode; and a third horizontal section, shorter than the second horizontal section, extending along the horizontal direction from the vertical section towards the adjacent drive electrode.

In another aspect, a method is performed by a touch sensor controller. The method includes: sequentially applying multiple pulses to each drive electrode of a plurality of drive electrodes arranged radially about a center of a touch sensor, the drive electrodes defining a perimeter about the center; for each drive electrode, measuring a response from a plurality of sense electrodes to the pulse applied to the drive electrode; and determining a location on a surface of the touch sensor based on the measured responses. Each drive electrode can include: an outer radial section extending radially along the perimeter; a central section extending from the outer radial section towards the center; and an inner radial section comprising a long section extending radially away from the central section in a first direction and a short section, shorter than the long section, extending radially away from the central section in a second direction.

The details of one or more disclosed implementations are set forth in the accompanying drawings and the description below. Other features, aspects, and advantages will become apparent from the description, the drawings and the claims.

DETAILED DESCRIPTION

System Overview

Figure 1:
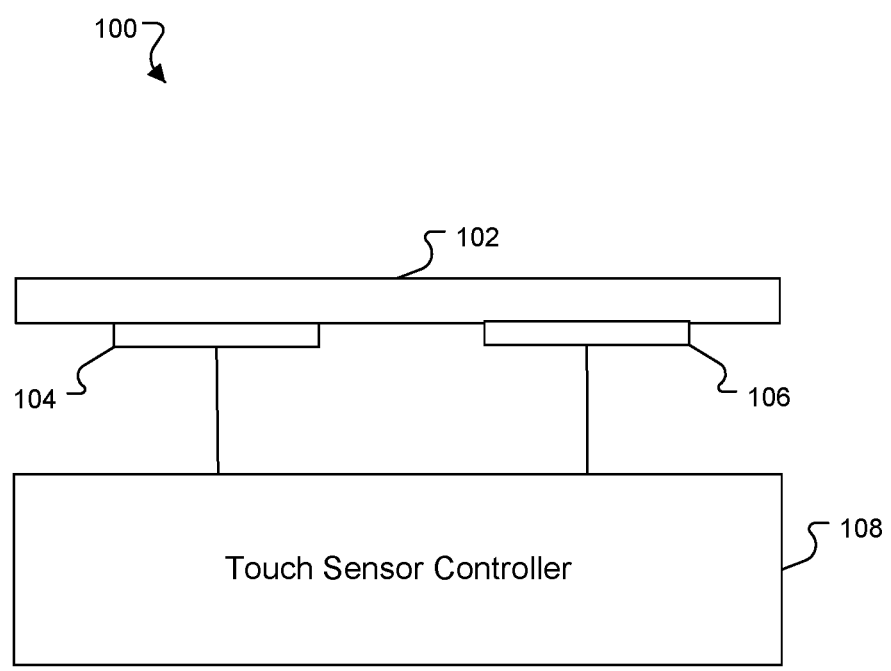
FIG. 1 is a block diagram of an example touch sensor including a dielectric surface layer, at least one drive electrode, at least one sense electrode, and a touch sensor controller.

FIG. 1 is a block diagram of an example touch sensor 100 including a dielectric surface layer 102, at least one drive electrode 104, at least one sense electrode 106, and a touch sensor controller 108. The touch sensor 100 can be implemented as an integrated circuit configured to detect touch by scanning electrode sets.

The electrodes 104 and 106 can be made from any suitable conducting material. In some implementations, the electrodes 104 and 106 are areas of copper on a printed circuit board. In some other implementations, the electrodes 104 and 106 are areas of clear conductive indium tin oxide on a glass or plastic touch screen.

Figure 2:
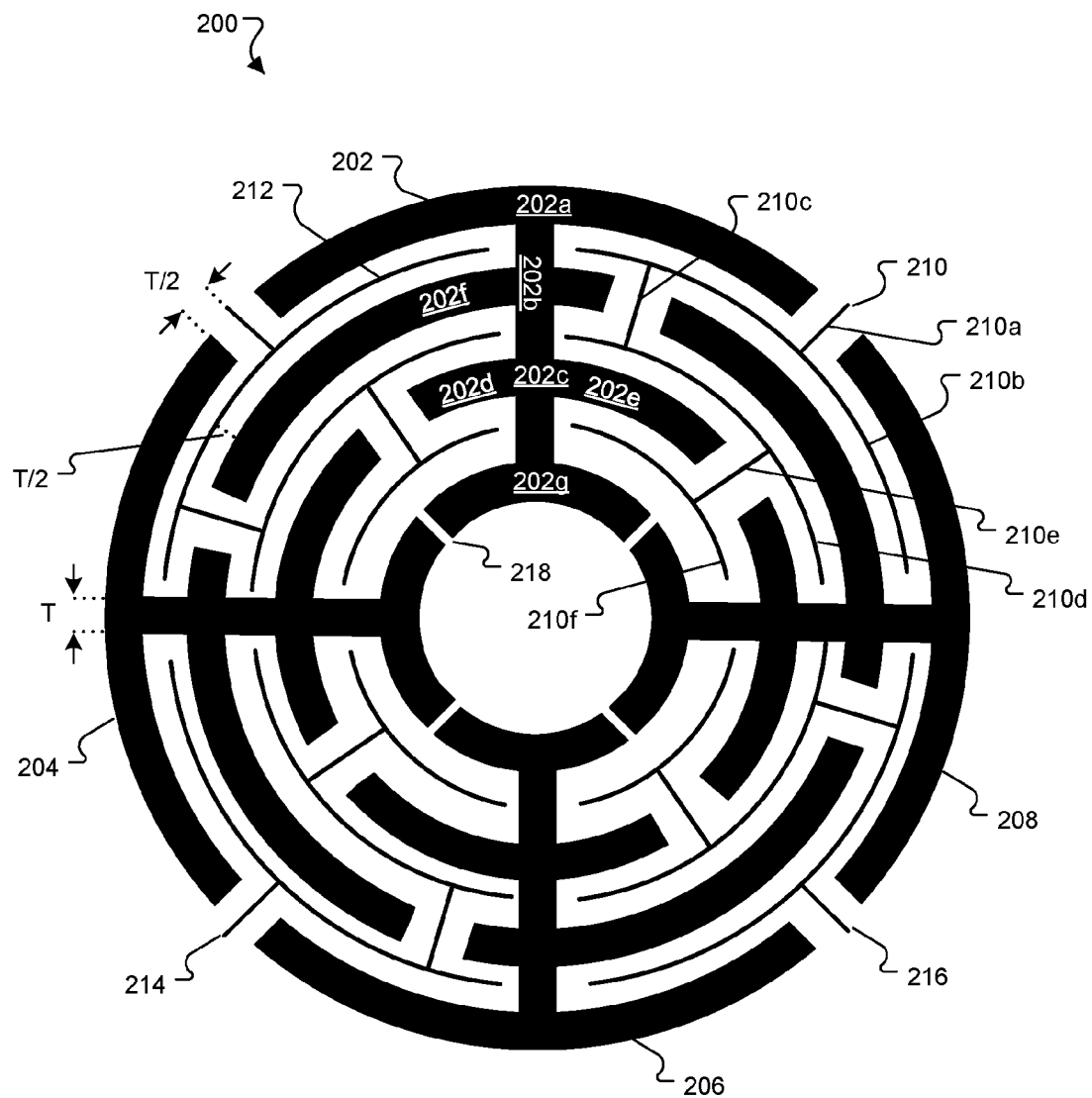
FIG. 2 is an overhead view of a first example touch sensor.

The touch sensor 100 can be used to replace mechanical switches of all kinds control panels, from domestic appliances to mobile phones. The touch sensor 100 can be, e.g., about 50 mm thick. The touch sensor 100 can be made to have varying key shapes and key placements, and the touch sensor 100 can be integrated with backlighting. For example, drive and sense electrodes can be arranged as shown in FIG. 2 to create a circular touch sensor 200 or as shown in FIG. 3 to create a rectangular touch sensor 300.

In operation, the touch sensor controller 108 applies a charge of logic pulses in a burst mode to the drive electrode 104 and monitors the response on the sense electrode 106. When a finger touches the dielectric surface layer 102, the field coupling is reduced, and the touch sensor controller 108 can detect the touch. The touch sensor controller 108 can output a detected location, e.g., in Serial Peripheral Interface (SPI) or I²C form.

The touch sensor controller 108, or another appropriate system of one or more computers, can be configured to perform touch sensing actions by virtue of having software, firmware, hardware, or a combination of them installed on the touch sensor controller 108 that in operation causes or cause the touch sensor controller 108 to perform the actions. One or more computer programs can be configured to perform particular actions by virtue of including instructions that, when executed by data processing apparatus, cause the apparatus to perform the actions.

Example Touch Sensor

FIG. 2 is an overhead view of a first example touch sensor 200. The touch sensor 200 includes four drive electrodes 202, 204, 206, and 208 and four sense electrodes 210, 212, 214, and 216 arranged in an alternating fashion between the drive electrodes. The sense electrodes can be electrically coupled to a common electrical node, e.g., in processing circuitry behind a surface of the touch sensor 200. The touch sensor 200 can be useful at least because it can be implemented in a single layer application and because it can provide a smooth signal transition as a finger moves radially around the sensor.

The drive electrodes are arranged radially about a center. The outer edges of the drive electrodes define a perimeter of the touch sensor 200 about the center. Drive electrode 202 includes an outer radial section 202a extending radially along the perimeter and a central section 202b extending from the outer radial section 202a towards the center.

Drive electrode 202 also includes three inner radial sections 202c, 202f, and 202g. Inner radial section 202c has a long section 202e extending radially, about the center, away from the central section 202b in a clockwise direction. Inner radial section 202c also has a short section 202d extending radially, about the center, away from the central section 202b in a counter-clockwise direction.

The short section 202d is shorter than the long section 202e. For example, consider a circle about the center that passes through inner radial section 202c. The long section 202e and the short section 202d together would have a length of about ¼ of the diameter of that circle, minus a distance across a gap for a sense electrode to pass through. The long section 202e can have about ⅔ of that length and the short section 202c can have about ⅓ of that length.

Inner radial section 202f has a similar structure to inner radial section 202c. Inner radial section 202g is centered over the central section 202b, but inner radial section 202g could also have a similar structure to inner radial section 202c. In some implementations, inner radial section 202g is separated from adjacent inner radial sections in a radial direction by gaps, e.g., gap 218, having a distance of about the thickness of the sense electrodes.

Sense electrode 210 includes a first central section 210a extending, through a gap between adjacent drive electrodes 202 and 208, from the perimeter towards the center. A first radial section 210b extends radially from an inner end of the first central section towards the adjacent drive electrodes 202 and 208. A second central section 210c extends, between inner radial sections of the adjacent drive electrodes 202 and 208, from the first radial section 210b towards the center. Similarly, sense electrode 210 includes a second radial section 210d, a third central section 210e, and a fourth radial section 210f. The sense electrode segments can be about 6 mm to 8 mm long.

In operation, the touch sensor 200 pulses the drive electrodes and measures a response from the sense electrodes. Because the central sections of the sense electrodes are staggered at different radial distances from the center, e.g., central section 210c and central section 210e, the touch sensor 200 can provide a smooth location signal as a finger moves radially about the touch sensor 200.

The touch sensor 200 is illustrated as having four drive electrodes and four sense electrodes, but other numbers of electrodes are possible. Similarly, the drive electrodes are illustrated as having one outer radial section and three inner radial sections, but different numbers of radial sections, of different lengths, are possible.

In some implementations, each section of the drive electrodes has a thickness T, and the distance between the drive electrodes and the sense electrodes is T/2. For example, a distance between the first radial section of each sense electrode and the outer radial section of each drive electrode can be T/2. A distance between a first long section of a first drive electrode and first short section of a second drive electrode can be T/2. A gap between a first outer radial section of a first drive electrode and a first central section of an adjacent sense electrode can span a distance of T/2.

Example Touch Sensor

Figure 3A:
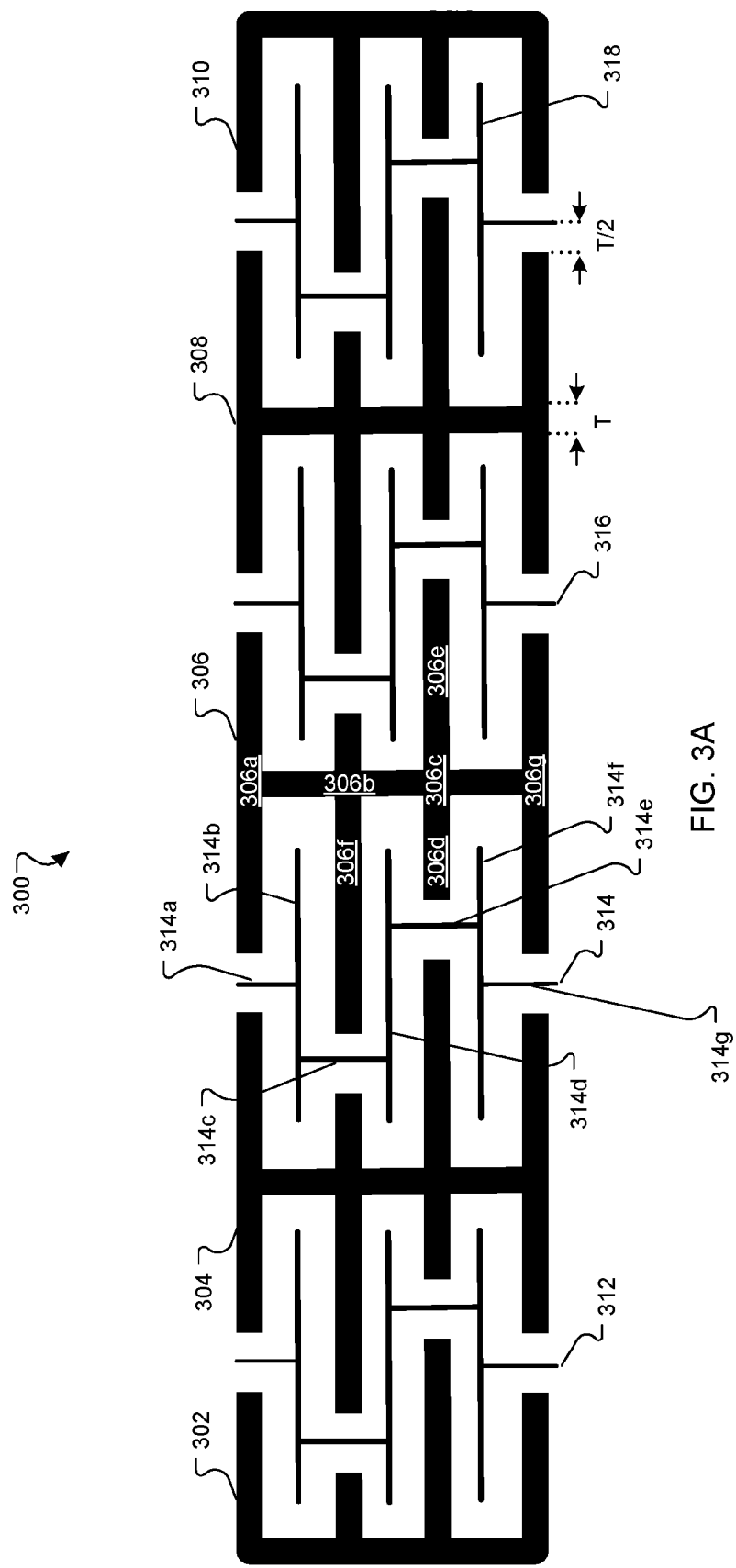
FIG. 3A is an overhead view of a second example touch sensor.

FIG. 3A is an overhead view of a second example touch sensor 300. The touch sensor 300 includes five drive electrodes 302, 304, 306, 308, and 310 and four sense electrodes 312, 314, 316, 318 arranged in an alternating fashion between the drive electrodes. The sense electrodes can be electrically coupled to a common electrical node, e.g., in processing circuitry behind a surface of the touch sensor 300. The touch sensor 300 can be useful at least because it can be implemented in a single layer application and because it can provide a smooth signal transition as a finger moves from a left side to a right side of the sensor 300.

The drive electrodes are arranged lengthwise along a rectangle. The rectangle has top and bottom sides defining a vertical direction, e.g., from drive electrode 302 to drive electrode 310. The rectangle has left and right sides defining a horizontal direction, e.g., from horizontal section 306a to horizontal section 306g.

Drive electrode 306 includes a top horizontal section 306a extending along the horizontal direction and a vertical section 306b extending along the vertical direction. Drive electrode 306 also includes two inner horizontal sections 306c and 306f. Inner horizontal section 306c includes a short horizontal section 306d extending along the horizontal direction away from the central section 306b and towards an adjacent drive electrode 304. Inner horizontal section 306c also includes a long horizontal section 306e extending away from the central section 306b towards an adjacent drive electrode 308.

The short horizontal section 306d is shorter than the long horizontal section 306e. For example, consider the distance between central section 306b and the central section of one of the adjacent drive electrodes 304 or 308. The long horizontal section 306e and the short horizontal section 306d together would have a length to span that distance, minus a distance across a gap for the sense electrode to pass through. The long section 306e can have about ⅔ of that length and the short section can have about ⅓ of that length.

Inner horizontal section 306f has a similar structure to inner horizontal section 306c. The top and bottom horizontal sections 306a and 306g are centered over the central section 306b, but those sections could also have long and short sections in a similar structure to that of inner horizontal section 306c.

Sense electrode 314 includes a first vertical section 314a extending, through a gap between adjacent drive electrodes 304 and 306, along the vertical direction. A first horizontal section 314b extends along the horizontal direction from a bottom of the first vertical section 314a. A second vertical section 314c extends, between inner horizontal sections of the adjacent drive electrodes 304 and 306, from the first horizontal section 314b towards the bottom. A second horizontal section 314d extends along the horizontal direction from a bottom of the second vertical section 314c.

A third vertical section 314e extends, between inner horizontal sections of the adjacent drive electrodes 304 and 306, from the second horizontal section 314d towards the bottom. A third horizontal section 314f extends along the horizontal direction from a bottom of the third vertical section 314e. A fourth vertical section 314g extends, through a gap between adjacent drive electrodes 304 and 306, from the third horizontal section 314f. The sense electrode segments can be about 6 mm to 8 mm long.

In operation, touch sensor 300 pulses the drive electrodes and measures a response from the sense electrodes. Because the vertical sections of the sense electrodes are staggered at different distances along the length of the touch sensor 300, e.g., vertical sections 314c and 314e, the touch sensor 300 can provide a smooth location signal as a finger moves lengthwise from left to ride along the touch sensor 300.

The touch sensor 300 is illustrated as having five drive electrodes and four sense electrodes, but other numbers of electrodes are possible. Similarly, the drive electrodes are illustrated has having top and bottom horizontal sections and two inner horizontal sections, but different numbers of inner horizontal sections, of different lengths, are possible.

In some implementations, each section of the drive electrodes has a thickness T, and the distance between the drive electrodes and the sense electrodes is T/2. For example, a distance between the first vertical section of each sense electrode and the top horizontal section of the drive electrode can be T/2. A distance between a first long section of a first drive electrode and a first short section of a second drive electrode can be T/2. A gap between a top horizontal section of a first drive electrode and a first vertical section of a first adjacent sense electrode spans a distance of T/2.

Figure 3B:
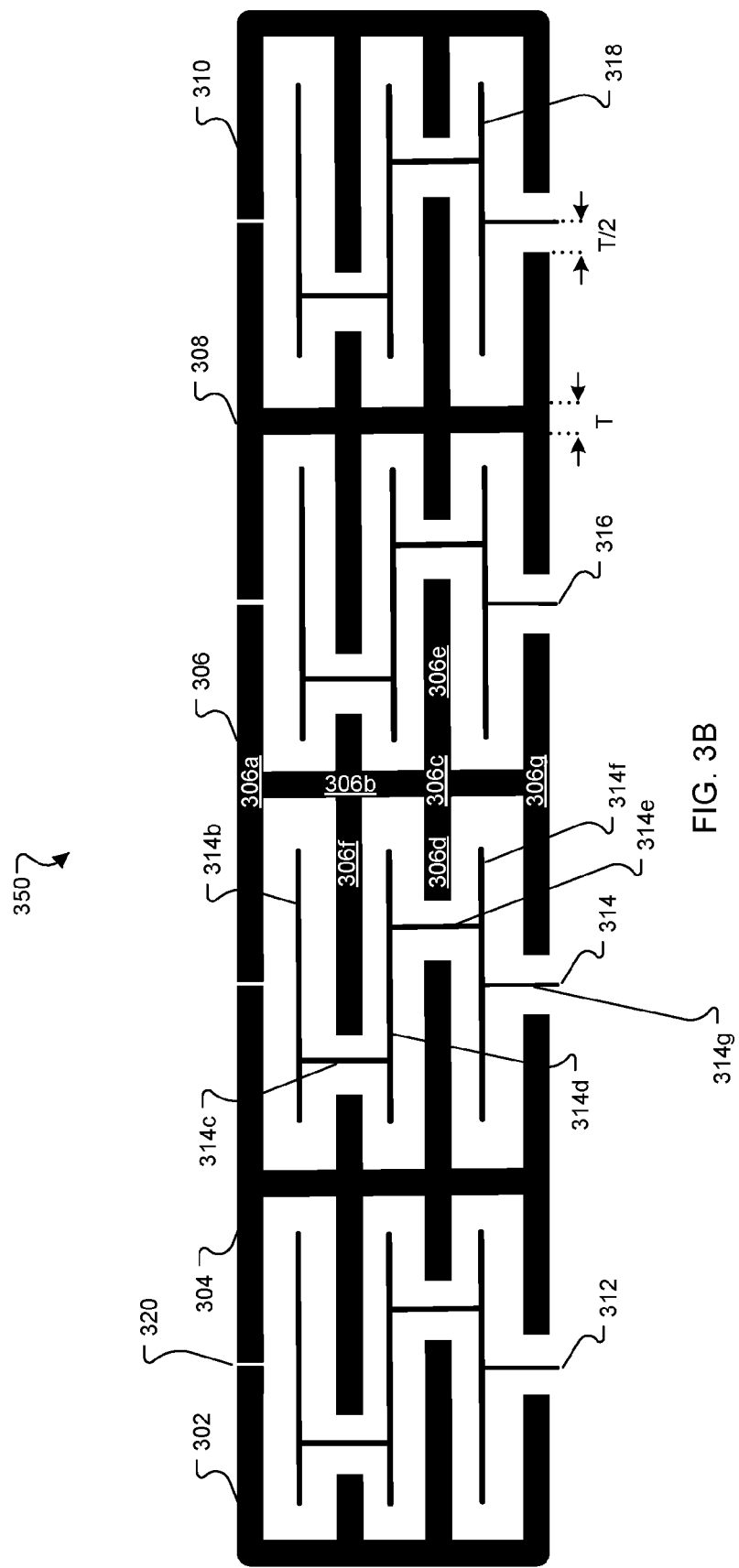
FIG. 3B is an overhead view of a third example touch sensor.

FIG. 3B is an overhead view of a fourth example touch sensor 300. The touch sensor 300, instead of having sense electrodes with vertical sections extending between top horizontal sections of adjacent drive electrodes, e.g., vertical section 314a in FIG. 3A, has narrow gaps, e.g., gap 320, between top horizontal sections of adjacent drive electrodes. The gaps can span a distance of about the thickness of the sense electrodes.

Example Connector Arrangement

Figure 4:
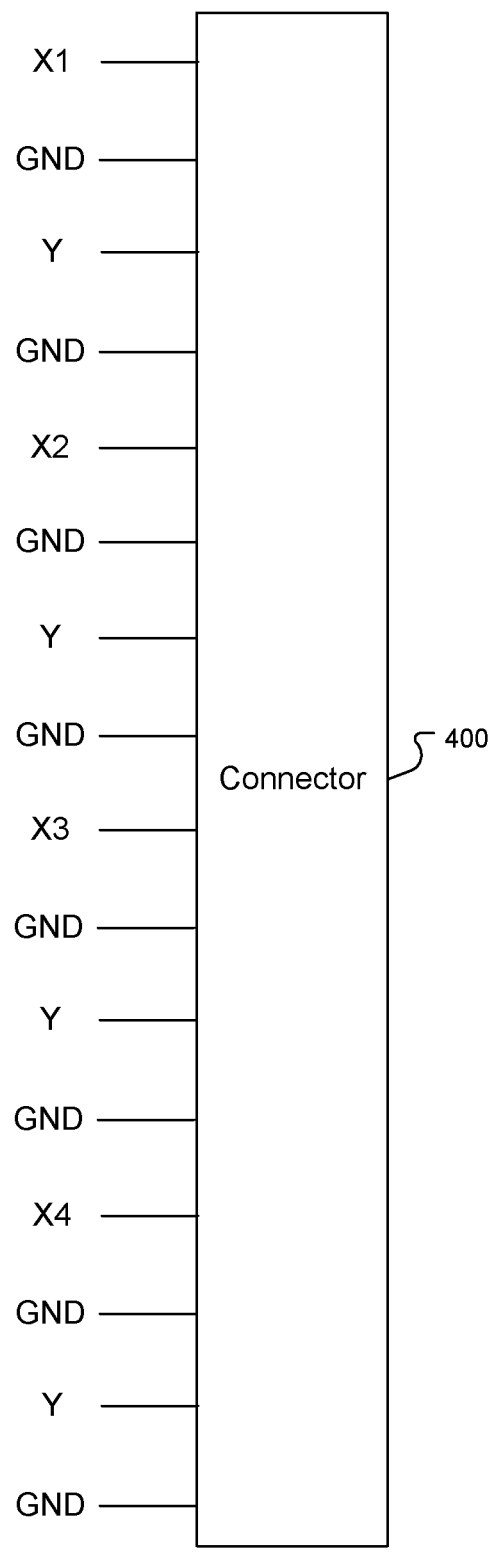
FIG. 4 is a block diagram of an example connector pin arrangement for a touch sensor.

FIG. 4 is a block diagram of an example connector pin arrangement ("pin out") 400 for a touch sensor, e.g., the touch sensor 200 of FIG. 2. The connector pin out 400 can be used for the touch sensor 300 of FIG. 3 by adding pins for a fifth drive electrode. The pins labeled "X1," "X2," "X3," and "X4" connect to the drive electrodes, and the pins labeled "Y" connect to the sense electrodes. The pins labeled "GND" connect to a ground node. The pins alternate between a drive electrode, a ground node, and a sense electrode. This can be useful, e.g., to reduce interference between electrodes.

Example Method

Figure 5:
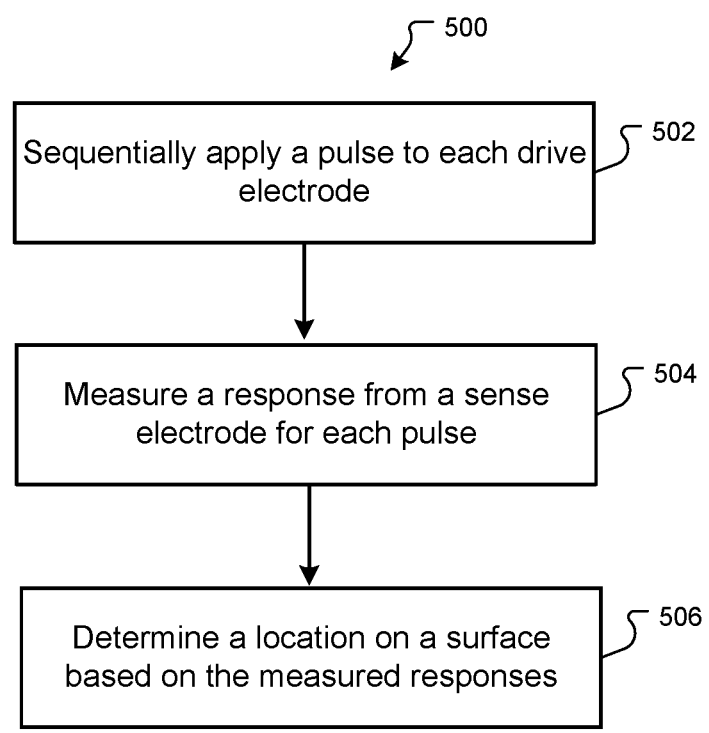
FIG. 5 is flow diagram of an example method performed by a touch sensor controller.

FIG. 5 is flow diagram of an example method 500 performed by a touch sensor controller, e.g., by the touch sensor controller 108 of FIG. 1. The touch sensor controller can be used, e.g., with the touch sensor 200 of FIG. 2 or the touch sensor 300 of FIG. 3.

The touch sensor controller sequentially applies a pulse to each drive electrode (502). Since the pulses are applied sequentially, each of one or more sense electrodes can respond different to each pulse, depending on the location of a finger on a surface of the touch sensor. The touch sensor controller measures a response from the sense electrodes (504). The touch sensor controller determines a location on the surface of the touch sensor based on the measured responses (506). The touch sensor controller can use any appropriate technique to determine the location based on the measured responses.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, microcontrollers or general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices, e.g., non-transitory computer readable media, for storing instructions.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A touch sensor comprising:
   a dielectric surface layer;
   a plurality of drive electrodes disposed on the dielectric surface layer and arranged radially about a center, the drive electrodes defining a perimeter about the center, wherein each drive electrode comprises:
   an outer radial section extending radially along the perimeter;
   a central section extending from the outer radial section towards the center; and
   an inner radial section comprising a long section extending radially away from the central section in a first radial direction and a short section, shorter than the long section, extending radially away from the central section in a second radial direction; and
   a sense electrode disposed on the dielectric surface layer and arranged between two of the drive electrodes, wherein a thickness of at least one section of the drive electrodes is associated with at least one of:
a distance between a first long section of a first drive electrode and a first short section of a second drive electrode, or
a gap between a first outer radial section of a first drive electrode and a first central section of the sense electrode adjacent to the first driver electrode.

2. The touch sensor of claim 1, wherein the sense electrode comprises:
a first central section extending, between first and second drive electrodes, from the perimeter towards the center;
a first radial section extending radially from an inner end of the first central section towards the first and second drive electrodes; and
a second central section extending, between a first long section of a first inner radial section of the first drive electrode and a first short section of a second inner radial section of the second drive electrode, from the first radial section towards the center.

3. The touch sensor of claim 2, wherein each section of the drive electrodes has a thickness T, and wherein a distance between the first radial section of each sense electrode and the outer radial section of each drive electrode is T/2.

4. The touch sensor of claim 1, wherein each section of the drive electrodes has a thickness T, and wherein a distance between a first long section of a first drive electrode and a first short section of a second drive electrode is T/2.

5. The touch sensor of claim 1, wherein each section of the drive electrodes has a thickness T, and wherein a gap between a first outer radial section of a first drive electrode and a first central section of the sense electrode adjacent to the first driver electrode spans a distance of T/2.

6. The touch sensor of claim 1, wherein the drive electrodes and the sense electrode are arranged on a single layer.

7. The touch sensor of claim 1, comprising a plurality of sense electrodes, wherein each sense electrode is electrically connected to a common sense electrode.

8. The touch sensor of claim 1, comprising:
a plurality of sense electrodes; and
a touch sensor controller configured to pulse each of the drive electrodes at different times and to measure a response from each of the sense electrodes.

9. A touch sensor comprising:
a dielectric surface layer;
a plurality of drive electrodes disposed on the dielectric surface layer and collectively arranged in a rectangular pattern, wherein each drive electrode comprises:
a first horizontal section extending along a horizontal direction;
a vertical section extending along a vertical direction;
a second horizontal section extending along the horizontal direction from the vertical section towards an adjacent drive electrode; and
a third horizontal section, shorter than the second horizontal section, extending along the horizontal direction from the vertical section towards the adjacent drive electrode; and
a sense electrode disposed on the dielectric surface layer and arranged between two of the drive electrodes,
wherein a thickness of at least one section of the drive electrode is associated with at least one of:
a distance between a first long section of a first drive electrode and a first short section of a second drive electrode, or
a gap between a top horizontal section of a first drive electrode and a first vertical section of the sense electrode adjacent to the first drive electrode.

10. The touch sensor of claim 9, wherein the sense electrode comprises:
a first vertical section extending along the vertical direction between first and second drive electrodes;
a first horizontal section extending along the horizontal direction from a bottom of the first vertical section; and
a second vertical section extending along the vertical direction from the first horizontal section and between the first and second drive electrodes; and
a second horizontal section extending along the horizontal direction from a bottom of the second vertical section.

11. The touch sensor of claim 10, wherein each section of the drive electrodes has a thickness T, and wherein a distance between the first vertical section of each sense electrode and the top horizontal section of the drive electrode is T/2.

12. The touch sensor of claim 9, wherein each section of the drive electrodes has a thickness T, and wherein a distance between a first long section of a first drive electrode and a first short section of a second drive electrode is T/2.

13. The touch sensor of claim 9, wherein each section of the drive electrodes has a thickness T, and wherein a gap between a top horizontal section of a first drive electrode and a first vertical section of the sense electrode adjacent to the first driver electrode spans a distance of T/2.

14. The touch sensor of claim 9, wherein the drive electrodes and the sense electrode are arranged on a single layer.

15. The touch sensor of claim 9, comprising a plurality of sense electrodes, wherein each sense electrode is electrically connected to a common sense electrode.

16. The touch sensor of claim 9, comprising:
a plurality of sense electrode; and
a touch sensor controller configured to pulse each of the drive electrodes at different times and to measure a response from each of the sense electrodes.

17. A method performed by a touch sensor controller, the method comprising:
sequentially applying multiple pulses to each drive electrode of a plurality of drive electrodes arranged radially about a center of a touch sensor, the drive electrodes defining a perimeter about the center, wherein each drive electrode comprises:
an outer radial section extending radially along the perimeter;
a central section extending from the outer radial section towards the center; and
an inner radial section comprising a long section extending radially away from the central section in a first direction and a short section, shorter than the long section, extending radially away from the central section in a second direction;
for each drive electrode, measuring a response from a plurality of sense electrodes to the pulse applied to the drive electrode; and
determining a location on a surface of the touch sensor based on the measured responses,
wherein one of the plurality of sense electrodes is arranged between two of the drive electrodes, and wherein a thickness of at least one section of the drive electrode is associated with at least one of:
a distance between a first long section of a first drive electrode and a first short section of a second drive electrode, or a gap between a first outer radial section of a first drive electrode and a first central section of an adjacent sense electrode.

18. The method of claim 17, wherein the sense electrodes are arranged in an alternating fashion between the drive electrodes.

19. The method of claim 18, wherein each sense electrode comprises:
   a first central section extending, between first and second drive electrodes, from the perimeter towards the center;
   a first radial section extending radially from an inner end of the first central section towards the first and second drive electrodes; and
   a second central section extending, between a first long section of a first inner radial section of the first drive electrode and a first short section of a second inner radial section of the second drive electrode, from the first radial section towards the center.

20. The method of claim 17, wherein the drive electrodes and the sense electrodes are arranged on a single layer, and wherein each sense electrode is connected to a common sense electrode.

\* \* \* \* \*